United States Patent
Pienta et al.

(10) Patent No.: US 8,260,928 B2
(45) Date of Patent: Sep. 4, 2012

(54) METHODS TO OPTIMALLY ALLOCATING THE COMPUTER SERVER LOAD BASED ON THE SUITABILITY OF ENVIRONMENTAL CONDITIONS

(75) Inventors: William Thomas Pienta, Prospect Heights, IL (US); Pornsak Songkakul, Mequon, WI (US)

(73) Assignee: Siemens Industry, Inc., Alpharetta, GA (US)

( * ) Notice: Subject to any disclaimer, the term of this patent is extended or adjusted under 35 U.S.C. 154(b) by 225 days.

(21) Appl. No.: 12/435,388

(22) Filed: May 4, 2009

(65) Prior Publication Data

US 2009/0276528 A1    Nov. 5, 2009

Related U.S. Application Data

(60) Provisional application No. 61/050,425, filed on May 5, 2008, provisional application No. 61/050,429, filed on May 5, 2008, provisional application No. 61/050,420, filed on May 5, 2008.

(51) Int. Cl.
*G06F 15/173* (2006.01)

(52) U.S. Cl. .......................... 709/226; 709/212; 455/450

(58) Field of Classification Search .................. 709/226, 709/212; 455/450
See application file for complete search history.

(56) References Cited

U.S. PATENT DOCUMENTS

| | | | |
|---|---|---|---|
| 7,290,213 B2* | 10/2007 | Kake et al. | 715/738 |
| 7,296,012 B2* | 11/2007 | Ohashi | 1/1 |
| 2002/0049725 A1* | 4/2002 | Nakade | 707/1 |
| 2003/0193777 A1 | 10/2003 | Friedrich et al. | |
| 2004/0077354 A1* | 4/2004 | Jason et al. | 455/450 |
| 2005/0055590 A1 | 3/2005 | Farkas | |
| 2005/0175497 A1* | 8/2005 | Arai et al. | 422/3 |
| 2006/0161307 A1 | 7/2006 | Bash | |
| 2006/0277474 A1* | 12/2006 | Robarts et al. | 715/745 |
| 2007/0100494 A1 | 5/2007 | Bash | |
| 2007/0136432 A1* | 6/2007 | Murakami et al. | 709/212 |
| 2007/0174275 A1* | 7/2007 | Kan et al. | 707/5 |
| 2008/0005591 A1 | 1/2008 | Trautman et al. | |
| 2008/0096663 A1* | 4/2008 | Lieberman et al. | 463/42 |
| 2008/0301719 A1* | 12/2008 | Roberts | 719/331 |
| 2009/0254419 A1* | 10/2009 | Mochizuki et al. | 705/10 |
| 2010/0198972 A1* | 8/2010 | Umbehocker | 709/226 |
| 2011/0029674 A1* | 2/2011 | Sidman | 709/226 |

OTHER PUBLICATIONS

Bash, et al. Published by 2007 USENIX Annual Technical Conference, Jun. 17-22, 2007, Santa Clara, Ca. (PP 0-9). Retrieved from the internet-URL: www.hpl.hp.com/techreports/2007/HPL-2007-62.html> Figures 1-7; Magazine.

Office Action for Corresponding Chinese Patent Application No. 200980115346.5.

* cited by examiner

*Primary Examiner* — Wing Chan
*Assistant Examiner* — Tesfay Yohannes

(57) ABSTRACT

A method includes generating a space information value for each of a plurality of spaces based on at least one environmental condition measurement for the corresponding space. Each space includes one or more computing devices. The space information value includes information regarding the relative suitability of a corresponding space for accepting computing load. The method also includes determining an allocation of additional computing load based on the space information values.

17 Claims, 3 Drawing Sheets

METHODS TO OPTIMALLY ALLOCATING THE COMPUTER SERVER LOAD BASED ON THE SUITABILITY OF ENVIRONMENTAL CONDITIONS

This application claims the benefit of U.S. Provisional Application Ser. No. 61/050,425 filed May 5, 2008, U.S. Provisional Application Ser. No. 61/050,429, filed May 5, 2008, and U.S. Provisional Application Ser. No. 61/050,420, filed May 5, 2008, all of which are incorporated herein by reference.

CROSS-REFERENCE TO RELATED APPLICATIONS

This application is related to our co-pending U.S. patent application, filed May 4, 2009, which is incorporate herein by reference.

FIELD OF THE INVENTION

The present invention relates generally to data processing centers, and more particularly, to the management of the operations of a data processing center.

BACKGROUND OF THE INVENTION

Data centers are parts of buildings or facilities in which a large number of server computers are located. The dense packing of the server computers results in the generation of a large amount of heat in a localized area. The data center must be cooled in a reliable manner in order to avoid the shutting down of, or damage to, the server computer hardware. Shutting down of server computers due to heat overload can cause significant economic loss.

Accordingly, specialized cooling units have been developed for implementation directly in data centers. These specialized cooling units are sometimes known in the art as computer room air conditioning units ("CRACs") or computer room air handling units. In this disclosure, air conditioning unit or CRAC will be understood to encompass any device used to effect cooling in a data center. CRACs have been employed as a result of the fact that the ordinary HVAC systems of buildings are not optimally configured to handle the concentrated head generated with data centers. Thus, CRACs are often used in connection with, but in addition to, the ordinary cooling units of a building employed for human comfort systems.

Many CRACs have simple, embedded controls that adjust the unit output based on factors such as sensed ambient air temperature. In some cases, CRACs have controllers the interact with the building automation system that controls or includes the building HVAC system, among other things.

While CRACs provide a solution to the need for enhanced cooling power within a data center having several server computers, there is nevertheless a danger of overheating, due to imbalanced loading of processing tasks within the data center, malfunction or inefficiency of a CRAC unit, or local conditions within the data center that affects the ability to cool certain servers or groups of servers. It is therefore desirable to reduce the risk of overheating or other malfunction of one or more processors in a data center.

SUMMARY

The present invention addresses the above identified needs, as well as others, by allocating processing load to spaces that are particularly suitable for handling additional processing. A space may be determined to be of high suitability based on temperature and/or other environmental conditions or current processing load within the space.

A first embodiment is a method that includes generating a space information value for each of a plurality of spaces based on at least one environmental condition measurement for the corresponding space. Each space includes one or more computing devices. The space information value includes information regarding the relative suitability of a corresponding space for accepting computing load. The method also includes determining an allocation of additional computing load based on the space information values.

The above described features and advantages, as well as others, will become readily apparent to those of ordinary skill in the art by reference to the following detailed description and accompanying drawings.

DETAILED DESCRIPTION

Figure 1:
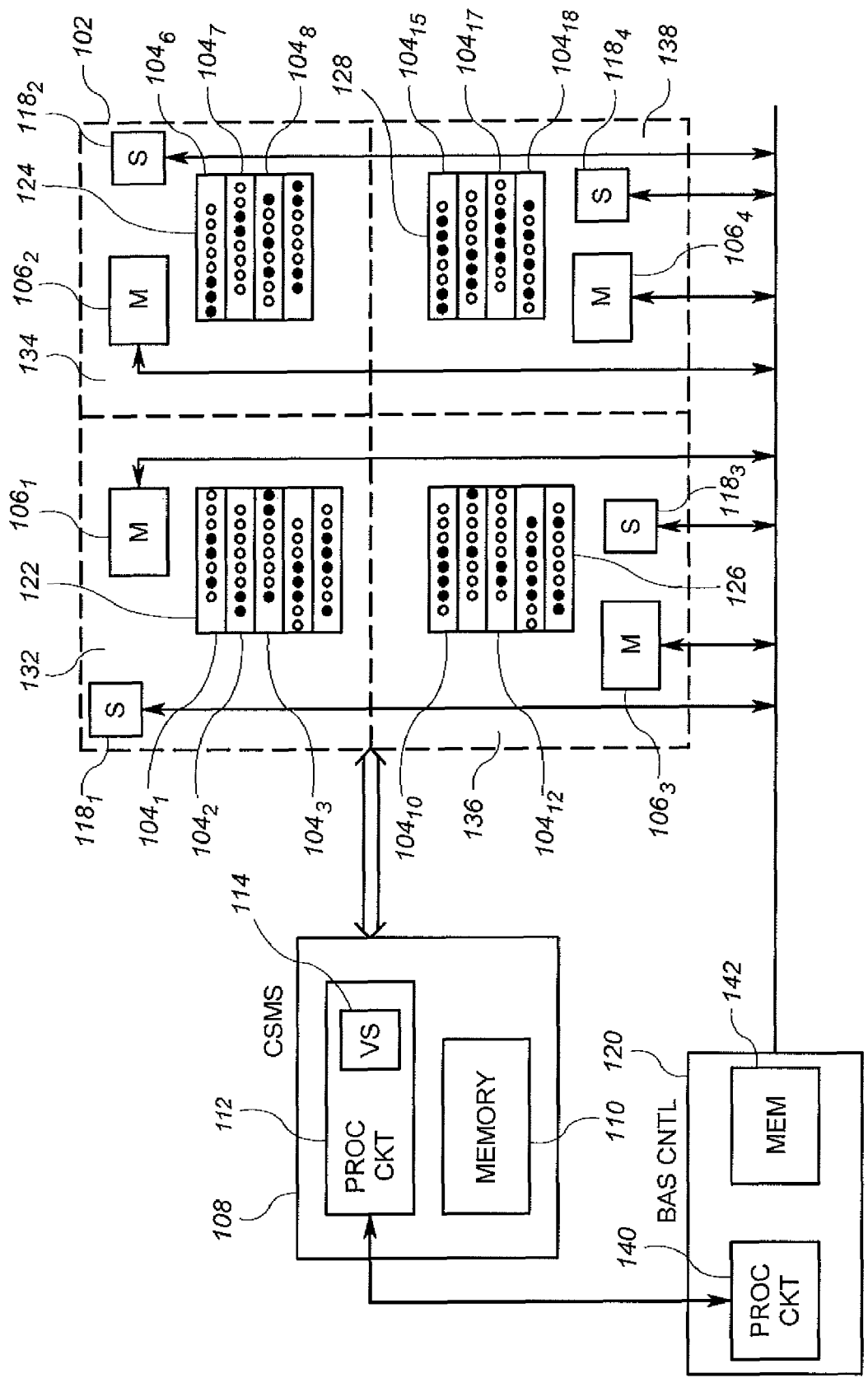
FIG. 1 shows a schematic block diagram of an exemplary arrangement according to a first embodiment of the invention implemented to coordinate application processing in an exemplary data center.

FIG. 1 shows an arrangement 100 according to an exemplary embodiment of the invention. The arrangement 100 is shown used in conjunction with a data center 102 that includes a plurality of server computers $104_1, 104_2 \ldots 104_{18}$ and a plurality of air conditioning units $106_1, 106_2, 106_3$, and $106_4$. The arrangement 100 includes a computer server management system 108 having, among other things, a memory 110 and a processing circuit 112. In this embodiment, the arrangement 100 further includes a BAS element 120, which is communicatively connected to the processing circuit 112.

Each of the server computers $104_1$ to $104_{18}$ is part of a set of computers that provide application processing services to at least one, and typically a large number of, client computers, not shown. The server computers $104_1$ to $104_{18}$ are typically arranged in racks and dispersed throughout the space of the data center 102. For example, as shown in FIG. 1, the server computers $104_1, 104_2, 104_3, 104_4$, and $104_5$ may be grouped on a first rack 122 of a first space 132 of the data center 102. Similarly, the server computers $104_6, 104_7, 104_8$ and $104_9$ may be grouped on a second rack 124 in a second space 134 of the data center 102, the server computers $104_{10}, 104_{11}, 104_{12}, 104_{13}$ and $104_{14}$ may be grouped on a third rack 126 of the third space 136 of the data center 102, and the server computers $104_{15}, 104_{16}, 104_{17}$ and $104_{18}$ may be grouped on a fourth rack 128 of a fourth space 138 of the data center 102.

It will be appreciated that data centers may have more servers per rack, more racks located in a single space, and more defined spaces. In other words, the basic structure of the data center 102 may be expanded (or even reduced) an a nearly infinite number of ways. The principles described in connection with the exemplary embodiment may readily be expanded to such other-sized data centers.

Each of the air conditioning units $106_1, 106_2, 106_3$, and $106_4$, is a computer room air conditioner or computer room air handler unit, collectively referred to as CRAC. The air conditioning units $106_1, 106_2, 106_3$, and $106_4$ may also be any air conditioning unit that is employed to specifically cool space within a data center or other area that is a high heat generator. Such devices are well known in the art. In this embodiment, each of the air conditioning units $106_1$, $106_2$, $106_3$, and $106_4$ is operably coupled the BAS element 120 such that the BAS element 120 can perform at least some measure of control over the operations of the air conditioning unit $106_n$. For example, if an air conditioning unit $106_n$ has self-contained temperature sensing and control, the BAS element 120 may be operably connected to override the on/off local control, and/or to provide a set point to the air conditioning unit $106_n$. Other air conditioning units may be configured for direct external control. In either event, the BAS element 120 preferably is operably connected to provide overall management and/or control of the each of the air conditioning units $106_1$, $106_2$, $106_3$, and $106_4$.

In the embodiment described herein, the air conditioning units $106_1$, $106_2$, $106_3$, and $106_4$ operate to cool, respectively, spaces 132, 134, 136 and 138. It is known in the art to position air conditioning equipment in a data center in order to focus the cooling capabilities of different air conditioning units on different spaces, even if the various spaces are not physically walled off. By way of example, it is known to arrange air conditioning units to form hot aisles and cool aisles, wherein the air conditioning units are specifically associated with respective cool aisles.

The BAS element 120 is one or more devices that are configured to communicate with, and operate within, a building automation system such as an HVAC system or the like. Such systems are known in the art and may have a general architecture of the APOGEE™ system available from Siemens Building Technologies Inc. The BAS element 120 includes at least one processing circuit 140 and a memory 142. The BAS element 120 may suitably take the form of a supervisory work station in a BAS such as the INSIGHT work station available from Siemens Building Technologies, Inc., of Buffalo Grove, Ill. In the alternative, the BAS element 120 may suitably be a configurable field controller, such as the PXC Modular field controller, also available from Siemens Building Technologies, Inc. In general, the processing circuit 140 is configured via other circuits to communicate BAS data (such as set points, sensor values, and commands) with other BAS devices such as other controllers, or even with sensors and actuators. The BAS element 120 may further includes special digital or analog I/O devices as may be necessary to communicate with control elements of the air conditioning units $106_1$, $106_2$, $106_3$, and $106_4$. In this embodiment, the BAS element 120 is further operably connected to communicate information with the computer server management system 108, and particularly the processing circuit 112. To this end, a suitable data interface is provided between the BAS element 120, which is configured for a BAS system, and the computer server management system 108, which is typically not set up for communication with a BAS system.

In the embodiment described herein, the BAS element 120 is configured to monitor environmental conditions within the data center 102, and particularly, in the spaces 132, 134, 136 and 138. To this end, the BAS element 120 is operably coupled to one or more environmental sensors $118_1$ located in the first space 132, one or more environmental sensors $118_2$ located in the second space 134, one or more environmental sensors $118_3$ located in the third space 136, and one or more environmental sensors $118_4$ located in the fourth space 138.

Each of the one or more sensors $118_1$ to $118_4$ may include at least one temperature sensor, as well as, optionally, humidity, air-flow, and/or pressure sensors. The sensors $118_1$ to $118_4$ are configured to provide information regarding environmental conditions in the spaces 132, 134, 136 and 138 to the BAS element 120. Such information may be used both for controlling the operation of the air conditioning units $106_1$, $106_2$, $106_3$, and $106_4$, as well as for determining the suitability of the spaces 132, 134, 136 and 138 for additional processing by server computers therein, as will be discussed below.

The computer server management system 108 is a computing system that is generally configured to coordinate the usage of the plurality of server computers $104_1$ to $104_{18}$. Such devices are generally known. To coordinate the server usage, the processing circuit 112 of the computer server management system 108 executes virtualization software 114. Virtualization software 114, as is known in the art, is software that, when executed by a computer processor otherwise properly configured, manages the allocation of application processes among a plurality of server computers, such as in a data center.

In accordance with this embodiment of the present invention, the processing circuit 112 is further configured to employ the virtualization software 114 to allocate application processes among the server computers $104_1$, $104_2$, etc. based on a measure of the suitability of the spaces 132, 134, 136 and 138. To this end, the memory 110 stores a space information value for each of a plurality of spaces 132, 134, 136 and 138. The space information value includes information regarding the relative suitability of a corresponding space for accepting computing load. The relative suitability of a space can be determined based on at least one environmental condition measurement for the corresponding space, as well as other factors. Further information regarding the development of space information values and/or suitability ratings is discussed further below in connection with FIGS. 2 and 3.

Referring again to FIG. 1, the computer server management system 108 is configured to allocate (via the virtualization software) one or more processing tasks to one of the plurality server computers $104_1$ to $104_{18}$ based in part on the relative suitability of the space in which the server computers $104_1$ to $104_{18}$ are located.

In particular, when an application is assigned to a server computer $104_n$, the execution of the application causes that server computer $104_n$ generate heat energy. The processing circuit 112 allocates the processing tasks such that the heat generated by the server computers 104 executing the processing tasks is distributed to a space in which the environment (and other factors) are in a condition amenable to accept further computational and thermal load.

To this end, it will be appreciated that server computers $104_1$ to $104_5$ generate heat in the space 132, server computers $104_6$ to $104_9$ generate heat in the space 134, computers $104_{10}$ to $104_{14}$ generate heat in the space 136, computers $104_{15}$ to $104_{18}$ generate heat in the space 138. If servers within a particular space are heavily utilized, and/or if the temperature in one or more spaces is particularly high, and/or the temperature is hard to reduce, then such a space would be less suitable (i.e. has a lower relative suitability) for additional computational activity relative to other spaces.

Accordingly, the processing circuit 112 allocates the processing tasks by favoring allocations of computational load to server computers 104 within spaces having a relatively high suitability index.

By way of example, consider a situation in which 100 applications must be allocated to the server computers $104_1$ to $104_{18}$. In the prior art, one way to allocate the applications may be to simply allocate a substantially an equal number of applications to each of the processors, such that in this example each of the server computers $104_1$ to $104_{18}$ would have five or six of the one hundred applications. Alternatively, the allocation may be based on attempting to keep the busyness of each of the server computers $104_1$ to $104_{18}$ roughly equal. Thus, if a particular server computer $104_n$ has a number of particularly computationally intensive tasks, it may have fewer overall applications. The computing speed and efficiency of the server computers $104_1$ to $104_{18}$ may also be taken into account. In any event, the prior art allocation attempts to evenly distribute the computational load.

However, it may be the case that such an allocation according to the prior art would create heat stress in a particular space 136, possibly leading to an unplanned shutdown or at least an alarm condition, while another space 132 is running cool. In such a case, it is advantageous to more heavily load some of the set of server computers $104_1$ to $104_5$ with the additional applications, and to more lightly load the server computers $104_{10}$ to $104_{14}$. Such an allocation distributes more heat to the cooler space 132 and less additional heat to the hotter space 136.

The processing circuit 112 thus determines the allocation of at least some processes based on the space information value (and the suitability index thereof) for each of the spaces 132, 134, 136 and 138.

In the general operation of FIG. 1, the server computers $104_1$ to $104_{18}$ provide application processing to client computers, not shown. The computer server management system 108 operates to assign application requests from clients to one or more of the server computers $104_1$ to $104_{18}$. Once the application requests are assigned to a server computer $104_n$, the server computer $104_n$ thereafter executes the application.

As each server computer $104_n$ executes applications, the microprocessor (and other circuitry) of the server computer generates heat, tending to warm the space around the server computer $104_n$. Thus, in this example, the computational operations of server computers $104_1$ to $104_5$ tend to generate heat in the space 132, the computational operations of server computers $104_6$ to $104_9$ tend to generate heat in the space 134, the computational operations of server computers $104_{10}$ to $104_{14}$ tend to generate heat in the space 136, and the computational operations of server computers $104_{15}$ to $104_{18}$ tend to generate heat in the space 138.

Because excessive heat can damage circuitry, cooling is necessary within the data center 102. In this example, the air conditioning units $106_1$, $106_2$, $106_3$, $106_4$ operate to cool, respectively, spaces 132, 134, 136 and 138. Each of the air conditioning units $106_1$, $106_2$, $106_3$, $106_4$ may suitably operate to cool its respective local space to a predetermined set point temperature. In this embodiment, the BAS element 120 can provide a set point temperature to each of the air conditioning units $106_1$, $106_2$, $106_3$, $106_4$, and can further control at least some aspects of the operation of the air conditioning units $106_1$, $106_2$, $106_3$, $106_4$.

The sensors $181_1$ to $118_4$ operate to provide temperature measurements, and optionally other environmental data, about the respective spaces 132 to 138, to the BAS element 120. Such measurement information is in some cases used to assist in the control of the air conditioning units $106_1$, $106_2$, $106_3$, $106_4$. In accordance with at least some embodiments of the invention, such measurement information is further used to generate a space information value (e.g. a suitability index value).

With respect to the space information value, the BAS element 120 provides environmental sensor data received from the sensors $181_1$ to $118_4$ to the processing circuit 112 of the computer server management system 108. The processing circuit 112 uses the received environmental sensor data regarding the spaces 132, 134, 136 and 138, as well as other information, to generate a suitability index. The other information that the processing circuit 112 may use to generate the suitability index includes loading (and forecasted loading) of the server computers within each space 132, 134, 136 and 138.

In any event, the processing circuit 112 thus generates a space information value, which in this case includes a suitability index calculated based on at least environmental information, for each of the spaces 132, 134, 136 and 138. The processing circuit 112 stores the suitability index for the spaces 132, 134, 136 and 138 in the memory 110.

The processing circuit 112 also has stored, in the memory 110, an identification of the space 132, 134, 136 and 138 in which each of the server computers $104_1$ to $104_{18}$ is located.

In this embodiment, the processing circuit 112 allocates processing tasks (applications) to the server computers $104_1$ to $104_{18}$ based at least in part on the suitability index of their corresponding spaces 132, 134, 136 and 138. If a large amount of applications must be assigned to servers, the processing circuit 112 preferably assigns more of the applications to spaces having a higher suitability index, and fewer of the applications to spaces having a lower suitability index. As a result, applications are routed more heavily to server computers located in an environment that is more conducive to accepting the additional thermal load that will result from the addition computational operations.

Figure 2:
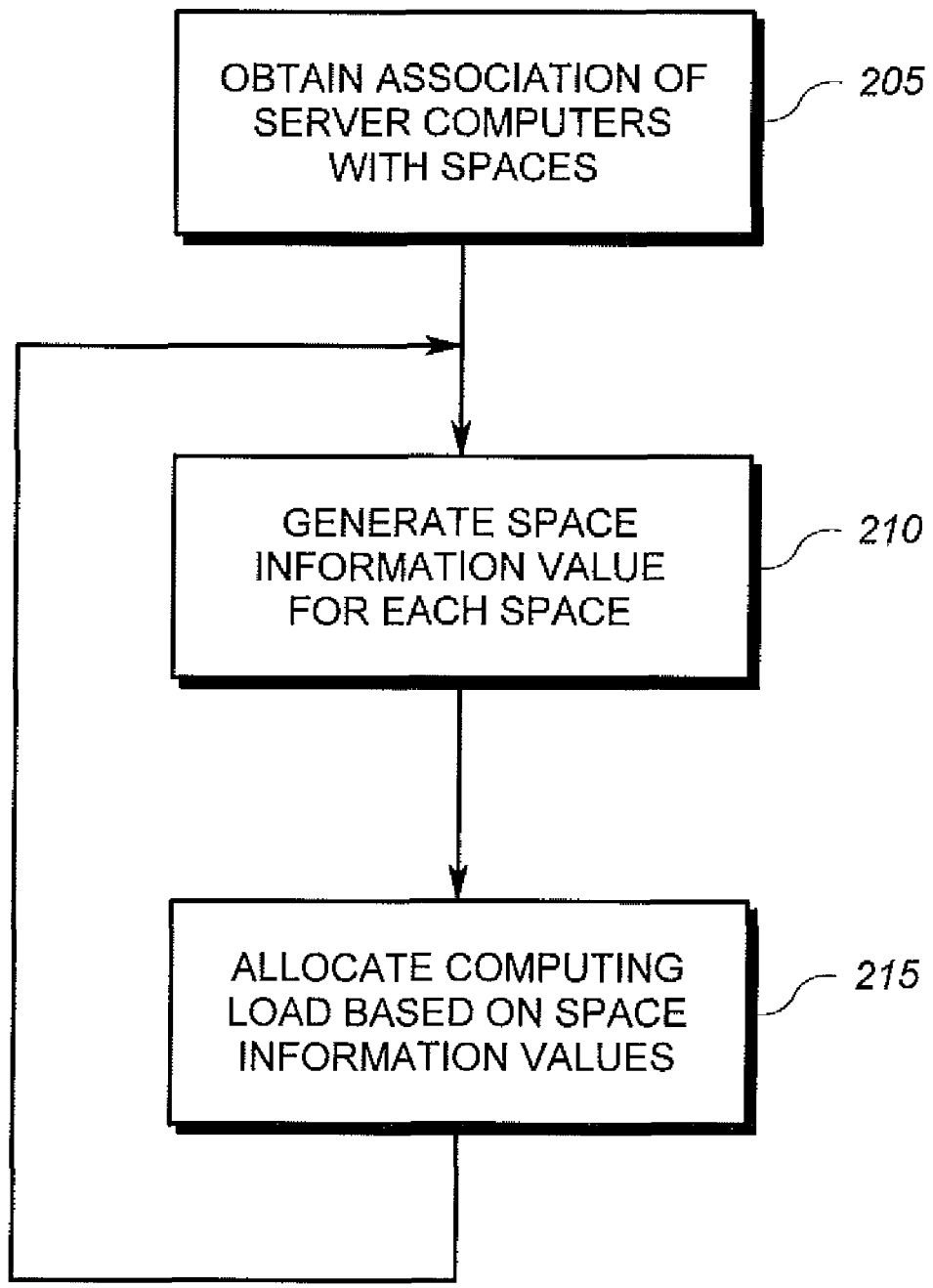
FIG. 2 shows an exemplary set of operations that may be carried in accordance with the present invention.

FIG. 2 shows an exemplary set of operations that may be performed by the processing circuit 112 to carry out the space suitability based allocation of processing tasks described above. It will be noted that all or some of these steps may alternatively be carried out by the processing circuit 140 in the BAS element 120, or in some other BAS device.

Referring to FIG. 2, in step 205, the processing circuit 112 obtains or generates an association of each server computer $104_n$ with one of the defined spaces 132, 134, 136 and 138. As discussed above, each of the spaces 132, 134, 136 and 138 in this example correspond directly to a single respective rack 122, 124, 126 and 128 and a single respective air conditioning unit $106_1$, $106_2$, $106_3$, $106_4$. However, it will be appreciated that multiple racks (each having multiple computers) may be located in a single space. Alternatively (and preferably), each rack may be subdivided into multiple "spaces". To this end, with the advent of wireless sensor modules, multiple wireless sensors may readily be implemented on different locations of a single server rack. As a result, granular environmental data may be obtained that further assists in finding localized hot spots or cool spots associated with particular servers. Similarly, it is not necessary that a single space be associated with a single air conditioning unit.

Indeed, the most significant influence in the meaningful definition of the spaces in a data center is the number and placement of sensors and/or server computers. To this end, so long as a space can be defined by at least one server computer, and has available space-specific environmental information, then a suitability index for such a space can advantageously be generated. For example, at least some embodiments contemplate the placement of at least four temperature sensors on each server rack. In such a case, at least four spaces may be defined for each rack. Using interpolation between sensors, one or more additional spaces may also be defined.

Regardless of how the spaces are defined, however, the processing circuit 112 obtains the association of each server computer with one of the defined spaces. In the exemplary embodiment of FIG. 1, the processing circuit 112 associates the server computers $104_1$, $104_2$, $104_3$, $104_4$, and $104_5$ with the first space 132 of the data center 102, the server computers $104_6$, $104_7$, $104_8$, and $104_9$ with the second space 134, the server computers $104_{10}$, $104_{11}$, $104_{12}$, $104_{13}$, and $104_{14}$ with the third space 136, and the server computers 104₁₅, 104₁₆, 104₁₇, and 104₁₈ with the fourth space 138.

The processing circuit 112 may suitably obtain the association of servers to defined spaces via user input, directly or indirectly via the BAS element 120. The user input identifies the layout of the server computers 104₁ to 104₁₈ with respect to a set of coordinates within the data center 102. The processing circuit 112 (and/or the BAS element 120) may further associate the sensors 118₁ to 118₄, as well as the air conditioning units 106₁ to 106₄, with the defined spaces 132, 134, 136 and 138.

Thereafter, in step 210, the processing circuit 112 generates a space information value for each space 132, 134, 136 and 138. The space information value includes a suitability index for the space. The suitability index takes into account temperature, and preferably, an indication loading of the server computers within the space, an indication of whether there are available server computers in the space, and whether pre-cooling is occurring within the space. Generation of the space information values is discussed in further detail below in connection with FIG. 3. Table 1 below provides exemplary space information values for the spaces 132, 134, 136 and 138 in tabular form.

TABLE 1

| SPACE | AVAIL | SUITABILITY |
|---|---|---|
| 132 | Yes | 30 |
| 134 | Yes | 90 |
| 136 | No | 0 |
| 138 | Yes | 100 |

In step 215, the processing circuit 112 then assigns applications to select ones of the server computers 104₁ to 104₁₈ based on the space information value. By way of example, the processing circuit 112 may suitably assign one or a few applications to server computers within the space having the highest suitability index. In the above example of Table 1, the processing circuit 112 would assign a new application to a server within the space 138. If there are multiple available servers within the selected space, as in the case of the space 138, the virtualization software 114 of the computer server management system 108 may suitably identify the specific server(s) in the determined suitable space to which the application(s) should be assigned. If granular temperature measurements are available within the defined space, the processing circuit 112 may attempt to assign the new application to a server closest to a sensor showing a low localized temperature.

If, on the other hand, a large number of applications must be assigned, then the processing circuit may allocate the applications to spaces in a manner proportional to the suitability index of the spaces. Referring to the example of Table 1, therefore, if one-hundred applications are to be assigned, then the processing circuit 112 may suitably assign 30/220 or 14 applications to server computers 104₁ to 104₅ within the space 132, assign 90/220 or 41 applications to server computers 104₆ to 104₉ within the space 134, and assign 100/220 or 45 applications to server computers 104₁₀ to 104₁₄ within the space 136. Similar to above, the virtualization software of the computer server management system 108 may suitably identify the specific server(s) in the determined space to which the identified application(s) should be assigned. Thus, for example, the virtualization software of the computer server management system 108 would identify how the fourteen applications are to be divided among the server computers 104₁, 104₂, 104₃, 104₄, 104₅, and so forth.

Accordingly, the operations of FIG. 2 show how the processing circuit 112 obtains suitability index information for defined spaces in a data center, and uses the suitability index information to assign application tasks to server computers located within those spaces. Using this process, computational load is advantageously directed to servers in locations having the best conditions for handling new thermal load.

Figure 3:
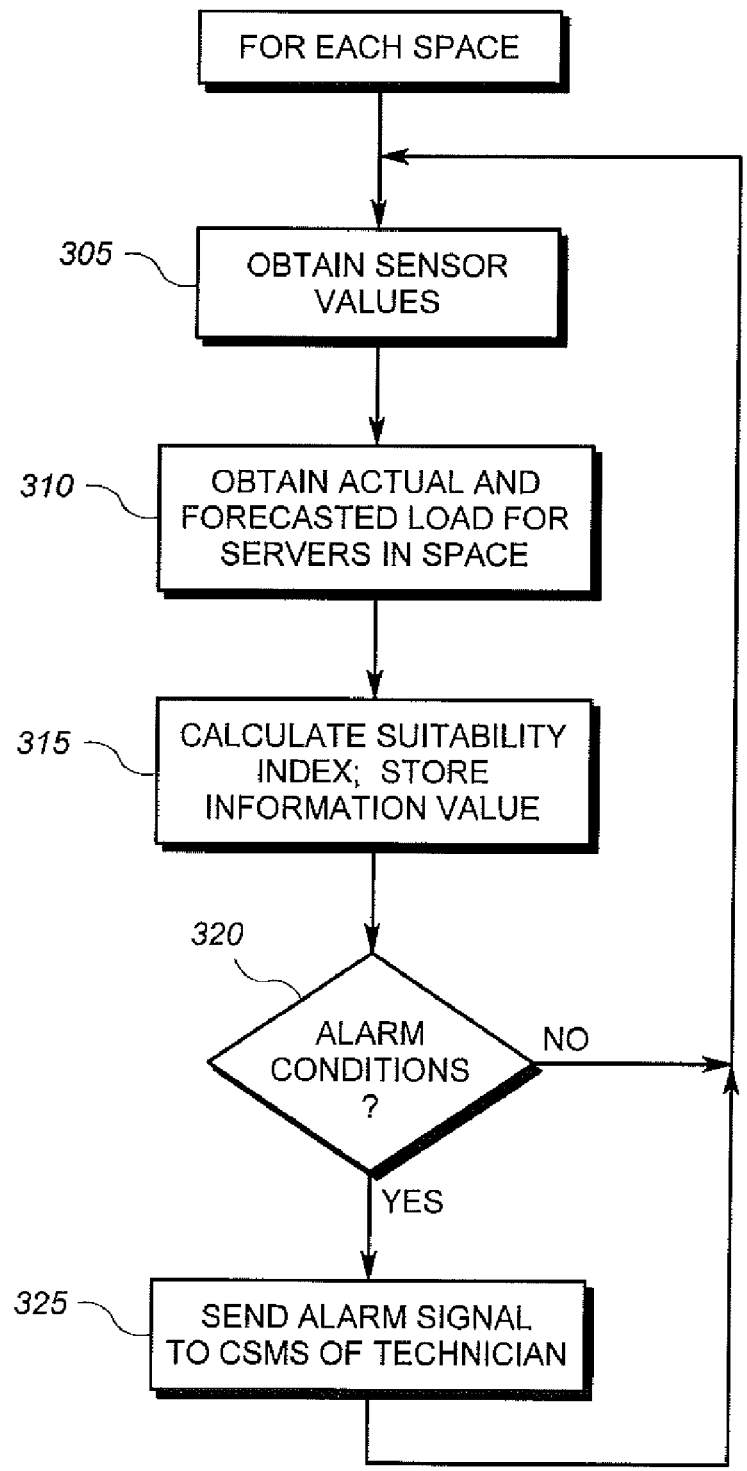
FIG. 3 shows in further detail an exemplary embodiment of at least one of the operations of FIG. 2.

FIG. 3 shows an exemplary set of steps that may be used to generate the suitability index for each defined space in a data center. The steps of FIG. 3 should be carried out periodically.

In step 305, the processing circuit 112 obtains sensor values for the given space from the BAS element 120. The BAS element 120, in turn, receives the sensor value from the sensors 181₁ to 118₄ via a wireless or wired building automation system data network. In the embodiment described herein, the sensor values will typically at least include temperature information for the corresponding space. It will be appreciated that the BAS element 120 or another device may alter, filter, average, or otherwise process the sensor values before providing the values to the processing circuit 112.

In step 310, the processing circuit 112 obtains the actual and forecasted loads for server computers within the selected space. Actual load data is readily available from the server computers themselves.

In step 315, the processing circuit 112 calculates a suitability index for the space based on the information obtained in steps 305 and 310. The suitability index is a function of the measured temperature, a calculated server load ratio, forecasted server load, pre-cool status and other environmental conditions (pressure, humidity, air flow) in this embodiment. More or less factors may be considered by those of ordinary skill in the art in other implementations.

With regard to measured temperature, the suitability index increases inversely as a function of the measured temperature (s) within a space. For example, all other things being equal, it is desirable to assign new applications to server computers in the coolest space.

With regard to server load ratio, the suitability index also rises inversely as a function of the current loading of the server computers within a space. All things (such as temperature) being equal, it is desirable to avoid attempting to assign an application wherein the server computers are all (or mostly) busy and not available.

With regard to predicted server load, suitability index rises inversely as a function of predicted server load within the space. If a server within the defined space is predicted to have a high load that cannot easily be moved to other servers, then it may be advantageous to avoid excessive heat that could result from assigning other new applications to servers in that space.

With regard to pre-cool, suitability index rises as a function of pre-cool status. A pre-cool status is one in which a particular space is being pre-cooled, typically in anticipation of an incoming heavy processing load. If the space is undergoing pre-cool, then it is advantageous to allocate additional computational load to the servers within that space.

With regard to other environmental measurements (humidity, etc.), suitability index increases as those values tend toward optimums, and decreases as those values tend toward unacceptable conditions. Notably, any unacceptable (i.e. alarm) conditions can cause the suitability index to drop to zero, regardless of other factors.

Once the suitability index for the space has been calculated, the processing circuit 112 proceeds to step 320. In step 320, the processing circuit 112 determines whether the suitability index indicates an alarm condition. For example, a suitability index of zero may be treated as an alarm condition.

If an alarm condition is detected, then the processing circuit 112 in step 325 signals the alarm to a visual display, or to a technician's portable wireless device via e-mail, text messaging, or paging. After step 325, the processing circuit 112 returns to step 305 to begin calculations of the suitability index on another space. Similarly, if no alarm condition is detected in step 320, the processing circuit 112 returns directly to step 305.

We claim:

1. A method, comprising:
   a) generating a space information value for each of a plurality of spaces based on at least one environmental condition measurement for the corresponding space, each space including one or more computing devices, the space information value including information regarding the relative suitability of a corresponding space for accepting computing load,
   b) determining within a processing circuit an allocation of additional computing load based on the space information values,
   c) distributing the additional computing load to the one or more computing devices in one or more of the plurality of spaces based upon the determined allocation of additional computing load,
   d) obtaining at least one sensor measurement from a sensor disposed within each of the plurality of spaces, and wherein the at least one environmental condition measurement for each space is based on the at least one sensor measurement for the space, and
   wherein the at least one environmental condition measurement comprises at least one of the groups consisting of: a temperature measurement, a humidity measurement, an air flow measurement, and a pressure measurement.

2. The method of claim 1, wherein step a) further comprises generating the space information value based at least in part on computing load information regarding the computing devices in each space.

3. The method of claim 1, wherein step b) further comprises
   b) selecting a first computing device for handling additional computing load from a plurality of computing devices based on an evaluation of the information regarding the relative suitability of a first space in which the first computing device is located and information regarding the relative suitability of other spaces.

4. The method of claim 1, further comprising:
   obtaining data identifying an association between each of a plurality of computer devices and a select one of the plurality of spaces; and wherein step b) further comprises determining the allocation of the additional computing load by allocating the additional computing load to computing devices associated with a first space based on the space information values of the first space and the other of the plurality of spaces.

5. The method of claim 4, wherein step b) further comprises:
   i) allocating more computing load to computing devices associated with one or more spaces having space information values representative of higher relative suitability; and
   ii) allocating less computing load to computing devices associated with one or more spaces having space information values representative of lower relative suitability.

6. The method of claim 1, further comprising:
   c) providing updated space information values at a subsequent time based on new environmental information; and
   d) determining a reallocation of at least some computing load based on the updated space information values.

7. The method of claim 6, wherein determining the reallocation includes moving a process from a first computing device in a first space to a second computing device in a second space.

8. The method of claim 1, wherein step a) further comprises: generating the space information value for each of a plurality of spaces based on at least a temperature measurement value for the corresponding space.

9. The method of claim 8, wherein step a) further comprises: generating the space information value for each of a plurality of spaces based on at least one of the group consisting of: a humidity measurement value for the corresponding space, an air flow measurement value for the corresponding space, and a pressure measurement value for the corresponding space.

10. The method of claim 8, wherein step a) further comprises:
    generating the space information value for each of a plurality of spaces based in part on a current computing load value of computing devices located within the corresponding space or a predictive computing load value of computing devices located within the corresponding space.

11. The method of claim 1, wherein step a) further comprises:
    generating the space information value for each of a plurality of spaces based in part on a predictive computing load value of computing devices located within the corresponding space.

12. A system, comprising
    a) a plurality of computing devices disposed in a plurality of spaces, such that each space includes one or more computing device;
    b) a processor arrangement configured to generate a space information value for each of a plurality of spaces based on at least one environmental condition measurement for the corresponding space, each space including one or more computing devices, the space information value including information regarding the relative suitability of a corresponding space for accepting computing load, and determine an allocation of additional computing load based on the space information values;
    c) at least one sensor disposed within each of the plurality of spaces, and wherein the first processor is further configured to obtain at least one sensor measurement from the at least one sensor disposed within each of the plurality of spaces, and wherein the at least one environmental condition measurement for each space is based on the at least one sensor measurement for the space; and
    wherein the processing circuit is further configured to cause distribution of the additional computing load to the one or more computing devices in one or more of the plurality of spaces based upon the determined allocation of additional computing load; and
    wherein the at least one environmental condition measurement comprises at least one of the groups consisting of: a temperature measurement, a humidity measurement, an air flow measurement, and a pressure measurement.

13. The system of claim 12, wherein the processor arrangement includes a first processor configured to generate the space information value and a second processor configured to determine the allocation of additional computing load.

14. The system of claim 12, further comprising: at least one sensor disposed within each of the plurality of spaces, and wherein the processor arrangement is further configured to obtain at least one sensor measurement from the at least one sensor disposed within each of the plurality of spaces, and wherein the at least one environmental condition measurement for each space is based on the at least one sensor measurement for the space.

15. The system of claim 12 wherein the processor arrangement is configured to select a first computing device for handling additional computing load from a plurality of computing devices based on an evaluation of the information regarding the relative suitability of a first space in which the first computing device is located and information regarding the relative suitability of other spaces.

16. The system of claim 12 wherein the processor arrangement is configured to obtaining data identifying an association between each of a plurality of computer devices and a select one of the plurality of spaces; and to determine the allocation of the additional computing load by allocating the additional computing load to computing devices associated with a first space based on the space information values of the first space and the other of the plurality of spaces.

17. A method, comprising:
generating a space information value for each of a plurality of spaces based on at least one environmental condition measurement for the corresponding space, each space including one or more server computers, the space information value generated with a processing circuit of a computer server management system and the space information value including information regarding the relative suitability of a corresponding space for accepting computing load, and determining an allocation of additional computing load based on the space information values, the allocation of additional computing load determined by the processing circuit distributing the additional computing load to the one or more computing devices in one or more of the plurality of spaces based upon the determined allocation of additional computing load;

obtaining at least one sensor measurement from a sensor disposed within each of the plurality of spaces, and wherein the at least one environmental condition measurement for each space is based on the at least one sensor measurement for the space, an wherein the at least one environmental condition measurement comprises at least one of the groups consisting of: a temperature measurement, a humidity measurement, an air flow measurement, and a pressure measurement.

* * * * *